United States Patent
Park

(10) Patent No.: US 10,310,644 B2
(45) Date of Patent: Jun. 4, 2019

(54) DIGITIZER CIRCUIT PATTERNING METHOD AND ELECTRONIC DEVICE SUPPORTING THE SAME

(71) Applicant: Samsung Electronics Co., Ltd., Suwon-si, Gyeonggi-do (KR)

(72) Inventor: Che Uk Park, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 196 days.

(21) Appl. No.: 15/064,012

(22) Filed: Mar. 8, 2016

(65) Prior Publication Data
US 2016/0266692 A1    Sep. 15, 2016

(30) Foreign Application Priority Data

Mar. 13, 2015 (KR) .................. 10-2015-0035304

(51) Int. Cl.
| | | |
|---|---|---|
| *G06F 3/041* | (2006.01) | |
| *G06F 3/046* | (2006.01) | |
| *H01L 27/32* | (2006.01) | |
| *B32B 7/12* | (2006.01) | |
| *B32B 15/08* | (2006.01) | |
| *B32B 15/20* | (2006.01) | |
| *B32B 27/28* | (2006.01) | |
| *B32B 3/02* | (2006.01) | |
| *G06F 3/047* | (2006.01) | |

(52) U.S. Cl.
CPC ............. *G06F 3/0412* (2013.01); *B32B 3/02* (2013.01); *B32B 7/12* (2013.01); *B32B 15/08* (2013.01); *B32B 15/20* (2013.01); *B32B 27/281* (2013.01); *G06F 3/046* (2013.01); *G06F 3/047* (2013.01); *H01L 27/323* (2013.01); *B32B 2307/202* (2013.01); *B32B 2307/206* (2013.01); *B32B 2307/416* (2013.01); *B32B 2457/208* (2013.01); *G06F 2203/04106* (2013.01); *G06F 2203/04108* (2013.01); *G06F 2203/04112* (2013.01)

(58) Field of Classification Search
CPC .......... G06F 3/046; G06F 2203/04106; G06F 2203/04108; G06F 3/041; B32B 2457/00; B32B 2457/208; G02F 1/13338; H01L 27/323

See application file for complete search history.

(56) References Cited

U.S. PATENT DOCUMENTS

| | | | | |
|---|---|---|---|---|
| 5,506,375 | A * | 4/1996 | Kikuchi | ................ G06F 3/046 178/18.02 |
| 6,756,970 | B2 * | 6/2004 | Keely, Jr. | ............ G06F 3/03545 178/18.01 |
| 7,875,814 | B2 | 1/2011 | Chen et al. | |
| 9,122,359 | B2 * | 9/2015 | Ishizaki | ............. G02F 1/13338 |

(Continued)

*Primary Examiner* — Bryan Earles
(74) *Attorney, Agent, or Firm* — Jefferson IP Law, LLP

(57) ABSTRACT

An electronic device is provided. The electronic device includes a reflector sheet disposed under a display panel and a digitizer disposed under the reflector sheet. The digitizer may include a first circuit layer including a conductive circuit pattern arranged in a first direction, a second circuit layer including a conductive circuit pattern arranged in a second direction, and an insulating layer electrically isolating the first circuit layer and the second circuit layer. The digitizer further includes at least one dummy circuit pattern formed on at least one of the first circuit layer or the second circuit layer.

16 Claims, 9 Drawing Sheets

(56) References Cited

U.S. PATENT DOCUMENTS

| | | | | |
|---|---|---|---|---|
| 9,170,696 B2* | 10/2015 | Ishizaki | ............ | G06F 3/044 |
| 9,471,166 B2* | 10/2016 | Sekiguchi | ............ | G06F 3/0412 |
| 9,626,022 B2* | 4/2017 | Ishizaki | ............ | G06F 3/041 |
| 9,651,812 B1* | 5/2017 | Peng | ............ | G02F 1/13338 |
| 2005/0133279 A1* | 6/2005 | Thacker | ............ | G06F 3/046 |
| | | | | 178/18.01 |
| 2007/0018076 A1 | 1/2007 | Chen et al. | | |
| 2009/0213090 A1* | 8/2009 | Mamba | ............ | G06F 3/044 |
| | | | | 345/174 |
| 2009/0315854 A1* | 12/2009 | Matsuo | ............ | G06F 3/0412 |
| | | | | 345/174 |
| 2011/0291977 A1 | 12/2011 | Moriwaki | | |
| 2013/0016363 A1* | 1/2013 | Iwamoto | ............ | G06F 3/044 |
| | | | | 356/616 |
| 2013/0242485 A1 | 9/2013 | Ohtani et al. | | |
| 2014/0333519 A1 | 11/2014 | Lee et al. | | |
| 2015/0015532 A1 | 1/2015 | Choung et al. | | |
| 2015/0324027 A1* | 11/2015 | Heo | ............ | G06F 3/041 |
| | | | | 345/173 |

* cited by examiner

DIGITIZER CIRCUIT PATTERNING METHOD AND ELECTRONIC DEVICE SUPPORTING THE SAME

CROSS-REFERENCE TO RELATED APPLICATION(S)

This application claims the benefit under 35 U.S.C. § 119(a) of a Korean patent application filed on Mar. 13, 2015 in the Korean Intellectual Property Office and assigned Serial number 10-2015-0035304, the entire disclosure of which is hereby incorporated by reference.

TECHNICAL FIELD

The present disclosure relates to a method for patterning a digitizer circuit at an electronic device including a digitizer.

BACKGROUND

Recent electronic devices support a touch input using an electronic pen (e.g., a stylus) as well as a touch input using a user's body. The touch input using the electronic pen is processed more accurately and more carefully than the touch input using the user's body.

A touch input method using the stylus includes electromagnetic resonance (EMR). EMR is a method in which a digitizer included in an electronic device senses an induction electromagnetic force from a stylus, and at least one conductive circuit capable of sensing an external electromagnetic force is patterned on the digitizer.

Conductive circuit patterns of the related art are formed at intervals, each of which is within a specific range, to sense the touch input. Furthermore, an interval between conductive circuits causes a step difference at some components of the digitizer. In the case where an interval between conductive circuits is wider than a specific magnitude or is irregular, a step difference becomes severer, thereby causing a shape change of a reflection sheet included in a back light unit (BLU). Consequently, a white spot occurs on a screen due to the shape change of the reflection sheet.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a circuit patterning method which makes it possible to regularly form intervals among circuits of a conductive circuit pattern and a dummy circuit pattern by adding the dummy circuit pattern on at least one circuit layer of a digitizer.

In accordance with an aspect of the present disclosure, an electronic device is provided. The electronic device includes a reflector sheet disposed under a display panel and a digitizer disposed under the reflector sheet. The digitizer may include a first circuit layer including a conductive circuit pattern arranged in a first direction, a second circuit layer including a conductive circuit pattern arranged in a second direction, an insulating layer electrically isolating the first circuit layer and the second circuit layer, and at least one dummy circuit pattern formed on at least one of the first circuit layer or the second circuit layer.

In accordance with another aspect of the present disclosure, an electronic device is provided. The electronic device includes a case, a display panel disposed in the case, a reflector sheet disposed under the display panel, and a digitizer disposed between the case and the reflector sheet, wherein the digitizer includes a first circuit layer comprising a conductive circuit pattern arranged in a first direction, a second circuit layer comprising a conductive circuit pattern arranged in a second direction, an insulating layer electrically isolating the first circuit layer and the second circuit layer, and at least one dummy circuit which is formed on at least one of the first circuit layer or the second circuit layer, and wherein the at least one dummy circuit is repeated to be spaced from conductive circuits constituting the conductive circuit pattern by a regular interval.

In accordance with another aspect of the present invention, an electronic device is provided. The electronic device includes a reflector sheet disposed under a display panel, and a digitizer disposed under the reflector sheet, wherein the digitizer includes an insulating layer, and at least one circuit layer formed on at least one surface of the insulating layer, and wherein the circuit layer includes a conductive circuit pattern, and a dummy circuit pattern.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
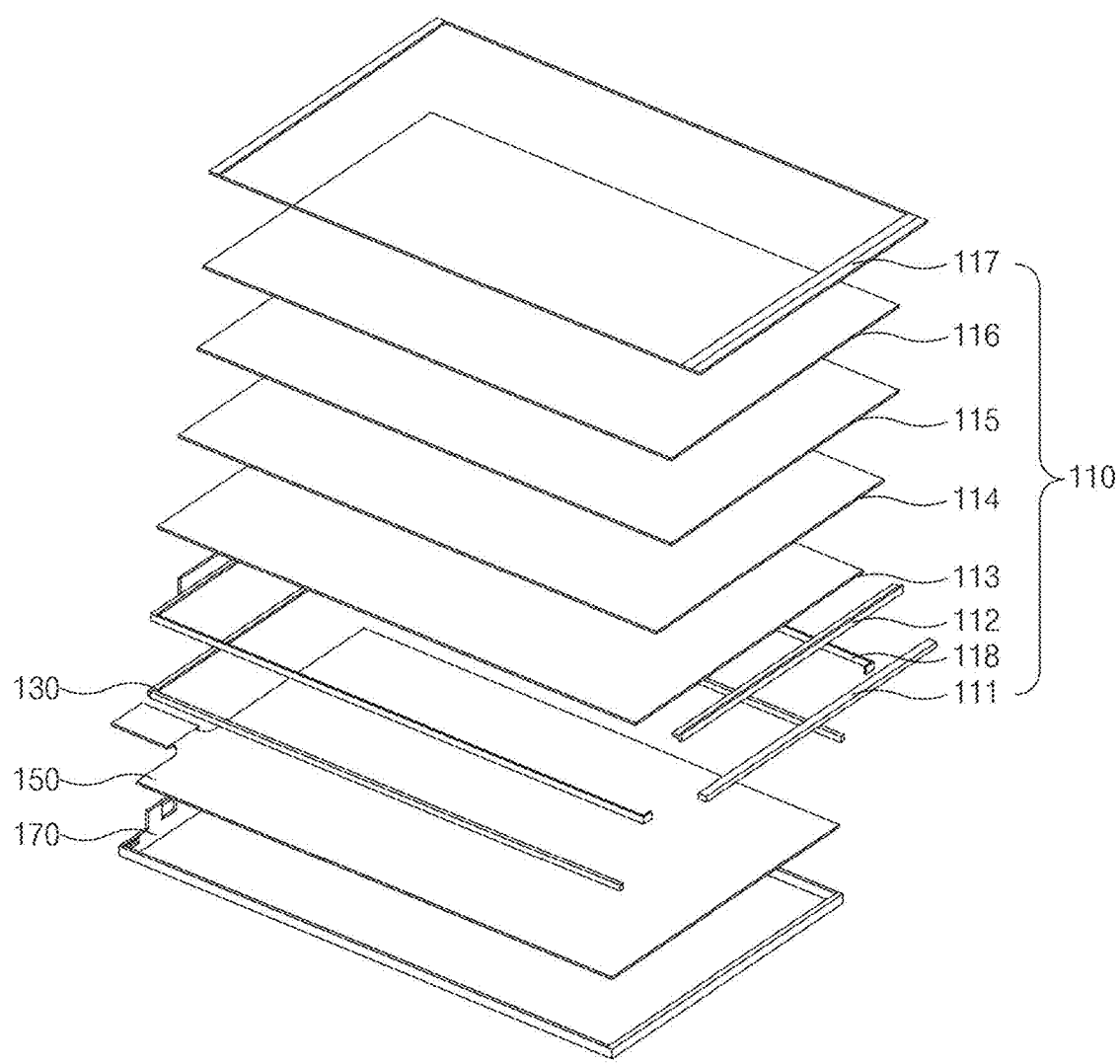
FIG. 1 is an exploded perspective view of a portion of an electronic device according to an embodiment of the present disclosure.

The following description with reference to accompanying drawings is provided to assist in a comprehensive understanding of various embodiments of the present disclosure as defined by the claims and their equivalents. It includes various specific details to assist in that understanding, but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but are merely used by the inventor to enable a clear and consistent understanding of the present disclosure. Accordingly, it should be apparent to those skilled in the art that the following description of various embodiments of the present disclosure is provided for illustration purposes only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

As used herein, the expressions "have", "may have", "include" and "comprise", or "may include" and "may comprise" indicate existence of corresponding features (e.g., elements such as numeric values, functions, operations, or components) but do not exclude presence of additional features.

Similarly, the expressions "A or B", "at least one of A or/and B", or "one or more of A or/and B", and the like used herein may include any and all combinations of one or more of the associated listed items. For example, the term "A or B", "at least one of A and B", or "at least one of A or B" may refer to all of the case (1) where at least one A is included, the case (2) where at least one B is included, or the case (3) where both of at least one A and at least one B are included.

Terms such as "first", "second", and the like used herein may refer to various elements of various embodiments of the present disclosure, but do not limit the elements. For example, such terms do not limit the order and/or priority of the elements. Furthermore, such terms may be used to distinguish one element from another element. For example, "a first user device" and "a second user device" indicate different user devices. For example, without departing the scope of the present disclosure, a first element may be referred to as a second element, and similarly, a second element may be referred to as a first element.

It will be understood that when an element (e.g., a first element) is referred to as being "(operatively or communicatively) coupled with/to" or "connected to" another element (e.g., a second element), the element can be directly coupled with/to or connected to the other element or an intervening element (e.g., a third element) may be present. In contrast, when an element (e.g., a first element) is referred to as being "directly coupled with/to" or "directly connected to" another element (e.g., a second element), it should be understood that there are no intervening elements (e.g., a third element).

According to the situation, the expression "configured to" used herein may be used as, for example, the expression "suitable for", "having the capacity to", "designed to", "adapted to", "made to", or "capable of". The term "configured to" must not mean only "specifically designed to" in hardware. Instead, the expression "a device configured to" may mean that the device is "capable of" operating together with another device or other components. central processing unit (CPU), for example, a "processor configured to perform A, B, and C" may mean a dedicated processor (e.g., an embedded processor) for performing a corresponding operation or a generic-purpose processor (e.g., CPU or an application processor (AP)) which may perform corresponding operations by executing one or more software programs which are stored in a memory device.

Unless otherwise defined herein, all the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal detect unless expressly so defined herein in various embodiments of the present disclosure. In some cases, even if terms are terms which are defined in the specification, they may not be interpreted to exclude embodiments of the present disclosure.

An electronic device according to various embodiments of the present disclosure may include at least one of smartphones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, mobile medical devices, cameras, or wearable devices.

According to an embodiment, the electronic device may be a home appliance. The smart home appliances may include at least one of, for example, televisions (TVs), digital versatile disc (DVD) players, audios, refrigerators, air conditioners, cleaners, ovens, microwave ovens, washing machines, air cleaners, set-top boxes, TV boxes (e.g., Samsung HomeSync™, Apple TV™, or Google TV™), game consoles (e.g., Xbox™ and PlayStation™), electronic dictionaries, electronic keys, camcorders, electronic picture frames, and the like.

According to various embodiments, the electronic devices may include at least one of medical measuring instruments (e.g., instruments for measuring blood sugar, blood pressure, heartbeat, temperature, and the like), medical devices (e.g., a magnetic resonance angiography (MRA), a magnetic resonance imaging (MRI), a computed tomography (CT), scanners, and ultrasonic devices), navigation devices, global positioning system (GPS) receivers, event data recorders (EDRs), flight data recorders (FDRs), vehicle infotainment devices, electronic equipment for vessels (e.g., navigation systems and gyrocompasses), avionics, security devices, head units for vehicles, industrial or home robots, automatic teller's machines (ATMs), points of sales (POSs), or internet of things (e.g., bulbs, various sensors, electric or gas meters, sprinkler equipment, fire alarms, thermostats, streetlamps, toasters, sports equipment, hot water tanks, heaters, boilers, and the like).

According to various embodiments, the electronic devices may include at least one of parts of furniture or buildings/structures having communication functions, electronic boards, electronic signature receiving devices, projectors, and measuring instruments (e.g., water meters, electricity meters, gas meters, and wave meters). According to various embodiments, the electronic device may be one of the above-described devices or a combination thereof. An electronic device according to an embodiment may be a flexible electronic device. Furthermore, an electronic device according to an embodiment may not be limited to the above-described electronic devices and may include other electronic devices and new electronic devices according to the development of technologies.

Hereinafter, electronic devices according to an embodiment of the present disclosure will be described with reference to the accompanying drawings. The term "user" used herein may refer to a person who uses an electronic device or may refer to a device (e.g., an artificial electronic device) that uses an electronic device.

FIG. 1 is an exploded perspective view of a portion of an electronic device according to an embodiment of the present disclosure.

Referring to FIG. 1, an electronic device may include a front case (not shown), a touch panel (not shown), a display panel (e.g., a liquid crystal panel (not shown)), a back light unit (BLU) 110, and a digitizer connection member 130, a digitizer 150, and a rear case 170. The electronic device may omit at least one of the above-described components or may further include other component(s). Furthermore, the components may be closely adhered to each other or may be stacked with some of the components spaced from each other.

The front case may be placed at the outermost face of the electronic device in the front direction to form a front appearance of the electronic device. The front case may include a transparent substance, for example, a glass, to allow a screen of the electronic device to be exposed to the outside, and a bezel area for supporting the glass may be included at a specific edge area of the front case.

The touch panel may be stacked on a back surface of the front case and may include a touch sensor capable of sensing a contact or a proximity of a touch object (e.g., a finger). The touch sensor may include a conductive material and may be arranged on the touch panel in an abscissa (or x-axis) direction and an ordinate (or y-axis) direction so as to form a lattice structure.

The liquid crystal panel may include a plurality of liquid crystal cells, each of which corresponds to a pixel unit, arranged in a matrix form and may express an image as the light transmittance of the liquid crystal cells is changed according to an image signal from a display control device (not shown). According to an embodiment, the liquid crystal panel may include a thin film transistor substrate (not shown), a color filter substrate (not shown) attached to face the thin film transistor substrate, and a liquid crystal (not shown) interposed between the thin film transistor substrate and the color filter substrate. Furthermore, the liquid crystal panel may include a first polarizing plate (not shown) attached on the front surface of the color filter substrate and a second polarizing plate (not shown) attached on the back surface of the thin film transistor substrate. The first polarizing plate and the second polarizing plate may be disposed to be cross-polarized. The second polarizing plate may polarize light incident to the liquid crystal panel, and the first polarizing plate may act as an analyzer.

A plurality of gate signal wires (not shown) and a plurality of data signal wires (not shown) may be formed on the thin film transistor substrate in the matrix form. Furthermore, thin film transistors (not shown) may be respectively formed at intersections of the gate signal wires and the data signal wires. According to an embodiment, the display control device may sequentially apply a driving signal to gate signal wires to activate a corresponding thin film transistor. In this case, the display control device may apply an image signal to a corresponding thin film transistor through the data signal wire. A signal voltage applied to a thin film transistor may be transferred to the liquid crystal by a pixel electrode (e.g., an indium tin oxide (ITO) electrode (not shown)) connected thereto, the liquid crystal may be aligned according to the signal voltage, and thus the light transmittance may be determined.

A color filter (not shown) composed of color pixels (e.g., red, green and blue (RGB) pixels) by which a color is expressed as light passes through the color pixels and a transparent common electrode (e.g., an ITO electrode) for applying a voltage to the liquid crystal cells may be formed on the color filter substrate. The area of the color filter substrate may be smaller than that of the thin film transistor substrate. In this case, a portion where the color filter substrate and the thin film transistor substrate are overlapped may be a display area of the liquid crystal panel, and a portion where the color filter substrate and the thin film transistor substrate are not overlapped may be a non-display area of the liquid crystal panel.

The BLU 110 may be stacked on the back surface of the liquid crystal panel and may supply light to the liquid crystal panel. The BLU 110 may include a lamp 111, a lamp reflector 112, a reflector sheet 113, a light guide plate (LGP) 114, a diffuser sheet 115, a prism sheet 116, a sheet panel 117, a mold frame 118, and the like.

The lamp 111 may supply light. For example, the lamp 111 may be a light emitting diode (LED) assembly. The lamp 111 may be disposed to be adjacent to the LGP 114. According to an embodiment, the lamp 111 may be disposed to be adjacent to at least a portion of one side of the LGP 114 and may be disposed in plurality along the one side thereof.

The lamp reflector 112 may reflect light from the lamp 111 so as to be directed to the LGP 114. The lamp reflector 112 may be disposed to be adjacent to the lamp 111 and may redirect the scattered light toward the LGP 114, thereby maximizing the efficiency of the lamp 111.

To prevent the light loss occurring when a portion of light emitted from the LGP 114 is directed toward the back surface of the liquid crystal panel, the reflector sheet 113 may redirect the light, which is directed toward the back surface of the liquid crystal panel, toward the LGP 114. For example, the reflector sheet 113 may include a material having high reflectance and may be stacked on the back surface of the LGP 114.

The LGP 114 may change light from the lamp 111 into plane light to allow the light to be uniformly incident to the liquid crystal panel. A pattern may be formed on a specific area of the back surface of the LGP 114 with specific area and shape. According to an embodiment, incident light may be scattered by the pattern formed on the back surface of the LGP 114 and may be uniformly distributed on the entire area of the liquid crystal panel.

The diffuser sheet 115 may be disposed on the front surface of the LGP 114 and may scatter light outputted from a surface of the LGP 114 in a specific direction so as to be distributed on the entire surface of the LGP 114. For example, the diffuser sheet 115 may diffuse light irradiated from the LGP 114 to the liquid crystal panel so as not to be concentrated, thereby improving uniformity of the light.

The prism sheet 116 may be stacked on the back surface of the sheet panel 117 and may increase luminance by refracting or concentrating light from the diffuser sheet 115. According to an embodiment, a plurality of prism sheets may be used at the same time, and the prism sheets may constitute a set.

The sheet panel 117 may further include at least one sheet-shaped panel for the BLU 110 as well as the above-described components. For example, the sheet panel 117 may include a protector sheet. The protector sheet may protect the prism sheet 116 from external shock or may prevent a foreign substance from flowing in. Furthermore, the protector sheet may prevent a moire phenomenon occurring when two prism sheets are used. The moire phenomenon refers to an optical illusion occurring when patterns arranged at equal intervals are iteratively overlapped. According to an embodiment, the diffuser sheet 115, the prism sheet 116, and the protector sheet may be sequentially stacked on the LGP 114.

The mold frame 118 may be a frame for fixing at least one component of the BLU 110 and may perform a shape maintaining function. For example, since top and bottom surfaces of the mold frame 118 are opened, the mold frame 118 may surround a sidewall of at least one of the reflector sheet 113, the LGP 114, the diffuser sheet 115, the prism sheet 116, or the sheet panel 117. According to various embodiments, since at least one sidewall of the mold frame 118 is opened, the mold frame 118 may be joined with at least one of the lamp 111 or the lamp reflector 112. Alternatively, a space for accommodating at least one of the lamp 111 or the lamp reflector 112 may be formed on at least one sidewall of the mold frame 118. According to another embodiment of the present disclosure, at least one sidewall of the mold frame 118 may extend to further surround at least one of the touch panel, the liquid crystal panel, or the digitizer 150 and may be able to be connected with the front case or the rear case 170.

The digitizer connection member 130 may be a substance connecting the BLU 110 and the digitizer 150. For example, the digitizer connection member 130 may be a tape or an adhesive. According to various embodiments, the digitizer connection member 130 may be omitted, in which case the BLU 110 and the digitizer 150 may be fastened by the mold frame 118 so as to be disposed to be adjacent to each other.

The digitizer 150 may be disposed on the back surface of the reflector sheet 113 and may sense a contact or a proximity of an electronic pen (e.g., a stylus) supporting the electromagnetic resonance (EMR). According to an embodiment, the digitizer 150 may include a conductive circuit pattern (or a signal pattern) capable of sensing an external electromagnetic force. For example, the digitizer 150 may sense an electromagnetic force emitted from the stylus based on the conductive circuit pattern and may determine a point where the sensed electromagnetic force is the greatest, as touch coordinates. Since the digitizer 150 distinguishes contacts or proximities of a user's body and the stylus, the digitizer 150 may support a palm rejection function in which a contact or a proximity by the user's body is ignored.

The rear case 170 may be placed at the outermost edge of the electronic device in a rear direction to form a rear appearance of the electronic device. According to an embodiment, the rear case 170 may support the digitizer 150 and may surround the back of the digitizer 150. According to an embodiment, the rear case 170 may further surround a sidewall of at least one of the touch panel, the liquid crystal panel, or the BLU 110 as well as a sidewall of the digitizer 150. According to another embodiment of the present disclosure, the rear case 170 may support the mold frame 118 and may surround at least one sidewall of the mold frame 118 or may be connected with the at least one sidewall of the mold frame 118.

Figure 2:
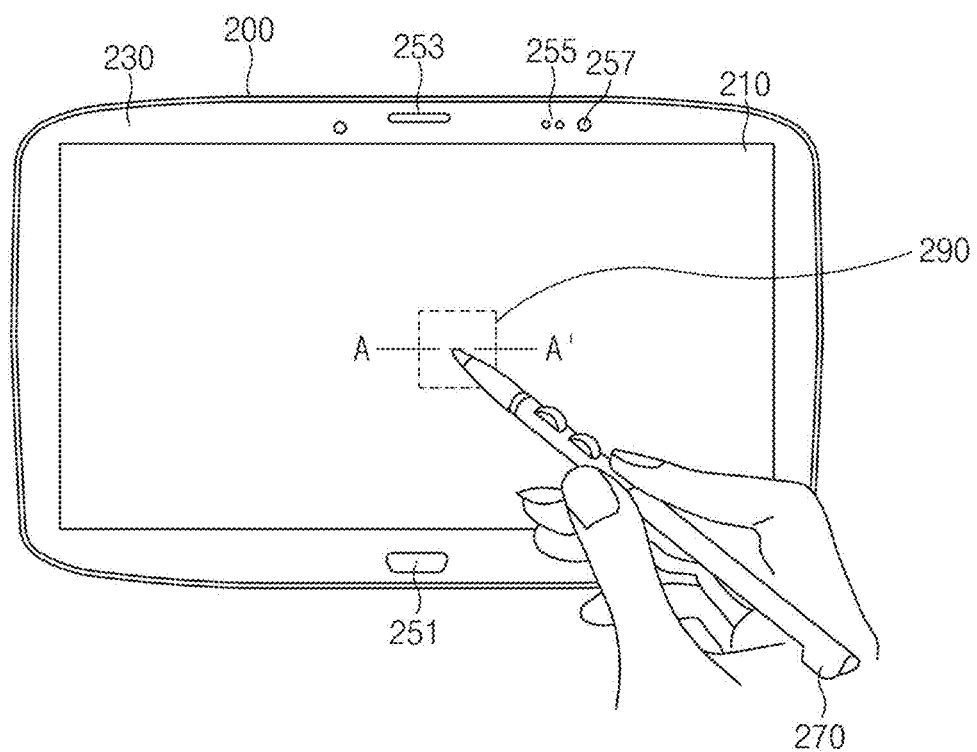
FIG. 2 is a diagram illustrating an electronic device according to an embodiment of the present disclosure.

FIG. 2 is a diagram illustrating an electronic device according to an embodiment of the present disclosure.

Referring to FIG. 2, an electronic device 200 may be configured to include at least one or more components of the electronic device described with reference to FIG. 1. A description the same as or similar to the above description will be omitted.

Referring to FIG. 2, the electronic device 200 may include a front case which is composed of a window 210 and a bezel 230 disposed at the edge of the window 210 so as to support the window 210. The window 210 may be formed of a transparent material to allow a screen of the electronic device 200 to be exposed to the outside. The bezel 230 may be connected with at least one edge of the window 210 and may extend toward the outer edge direction of the electronic device 200 so as to be connected with a side area of the electronic device 200. When a user grips the electronic device 200, the bezel 230 may be a grip area. Furthermore, the bezel 230 may include a space formed such that various function modules of the electronic device 200 are exposed to the outside. For example, the bezel 230 may include a space formed at a specific area of the bottom end portion of the bezel 230 in a top plan view to allow a physical button (e.g., a home button 251) to be exposed to the outside. Furthermore, the bezel 230 may include a space formed at a specific area of the top end portion in a top plane view to allow a speaker 253, a proximity sensor 255, or a camera 257 to be exposed to the outside. In addition, the bezel 230 may include a space formed at a specific area to allow a function module(s) (e.g., a physical button, a sensor, or the like) to be exposed to the outside.

The electronic device 200 may sense a contact or proximity of the stylus 270 based on a digitizer (e.g., the digitizer 150 of FIG. 1) disposed therein. The stylus 270 may be an electronic pen supporting the EMR and may include a resonance circuit composed of a capacitor and an inductor. The resonance circuit may generate an induced current through resonance with an external electromagnetic force, and the induced current may be stored in the inductor and the capacitor. Furthermore, if emission of the external electromagnetic force is interrupted, the resonance circuit may resonate by an induced current stored therein and may emit an inducted electromagnetic force. The induced electromagnetic force thus emitted may be sensed by a conductive circuit pattern included in the digitizer 150. The digitizer 150 may determine touch coordinates based on the intensity of the induced electromagnetic force thus sensed.

Figure 3:
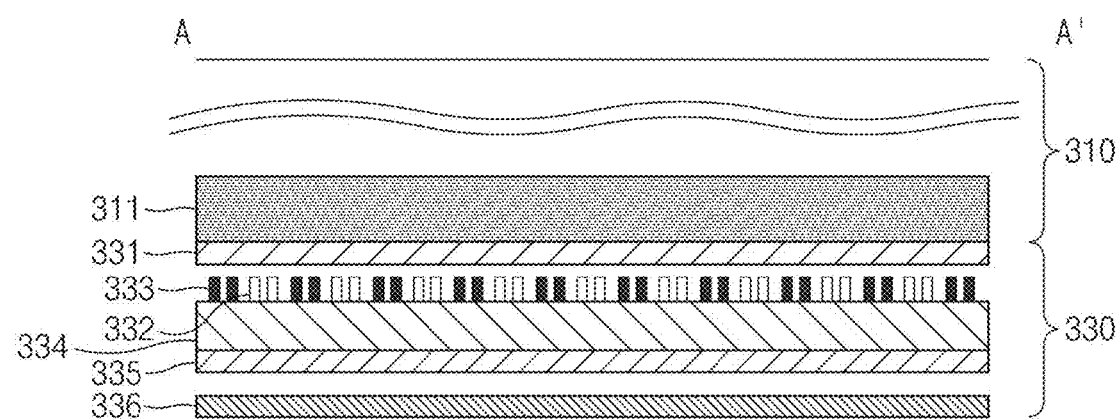
FIG. 3 is a cross-sectional view of a portion of an electronic device according to an embodiment of the present disclosure.

FIG. 3 is a cross-sectional view of a portion of an electronic device according to an embodiment of the present disclosure. FIG. 3 is a cross-sectional view of a portion (e.g., an area 290) of an electronic device 200 taken along a line A-A' of FIG. 2.

Referring to FIG. 3, an electronic device may have a structure in which components disposed therein are closely adhered to each other or are stacked with some of the components spaced from each other. The electronic device may have a structure in which the front case (not shown), the touch panel (not shown), the liquid crystal panel (not shown), the BLU 310, the digitizer 330, and the rear case (not shown) are sequentially stacked with the front case disposed at the uppermost layer.

For example, the reflector sheet 311 may be disposed at the lowermost layer of the BLU 310, and the digitizer 330 may be stacked on the bottom surface of the reflector sheet 311. The digitizer 330 may include a first insulating layer 331, a first circuit pattern 332 (or a signal pattern), a dummy circuit pattern 333 (or a dummy pattern), a second insulating layer 334, a second circuit pattern 335, a third insulating layer 336, and the like.

The first insulating layer 331 may be disposed at the uppermost layer of the digitizer 330 so as to be stacked on the back surface of the reflector sheet 311. The first insulating layer 331 may include an insulating material, for example, synthetic resin such as polyimide. The second insulating layer 334 may be disposed under the insulating layer 331. The second insulating layer 334 may include an insulating material such as polyimide.

Circuit patterns may be formed on opposite surfaces of the second insulating layer 334. For example, a first circuit pattern 332 may be formed on one surface of the second insulating layer 334, and a second circuit pattern 335 may be formed on a surface opposite to the one surface of the second insulating layer 334. The first circuit pattern 332 and the second circuit pattern 335 may include conductive circuits (e.g., circuits including a conductive material such as copper (CU)) formed in different directions. For example, in the case where the first circuit pattern 332 includes a plurality of conductive circuits arranged in an abscissa (or y-axis) direction, the second circuit pattern 335 may include a plurality of conductive circuits arranged in an ordinate (or x-axis) direction. According to an embodiment, a plurality of conductive circuits constituting the first circuit pattern 332 and the second circuit pattern 335 may be formed in a loop shape.

The third insulating layer 336 may be disposed under the second insulating layer 334. The third insulating layer 336 may include an insulating material, for example, synthetic resin such as polyimide. The first insulating layer 331 and the first circuit pattern 332 may be adhered by an adhering material, for example, an adhesive to each other, and the third insulating layer 336 and the second circuit pattern 335 may be adhered by an adhering material, for example, an adhesive to each other.

In addition to a circuit pattern, a dummy circuit pattern may be formed on at least one of opposite surfaces of the second insulating layer 334. For example, as illustrated in FIG. 3, in addition to the first circuit pattern 332, a dummy circuit pattern 333 may be formed on one surface of the second insulating layer 334. Furthermore, although not shown, in addition to the second circuit pattern 335, a dummy circuit pattern may be formed on another surface of the second insulating layer 334. The dummy circuit pattern 333 may prevent a white spot occurring when the reflector sheet 311 is changed due to the pressure according to a touch of the stylus (e.g., the stylus 270 of FIG. 2). For example, the dummy circuit pattern 333 may be formed between conductive circuits, constituting the first circuit pattern 332, with a specific pattern. If a circuit layer composed of the first circuit pattern 332 and the dummy circuit pattern 333 has pattern uniformity, it may be possible to reduce a step difference due to the pressure. For example, the dummy circuit pattern 333 may be formed such that intervals among circuits of the circuit layer or heights of the circuits are regular. According to an embodiment, the dummy circuit pattern 333 may be formed differently according to a kind or quality of a material of the reflector sheet 311. For example, the dummy circuit pattern 333 may be formed such that intervals among circuits of the circuit layer become narrower as the hardness of a material of the reflector sheet 311 becomes weaker.

Unlike the first circuit pattern 332 and the second circuit pattern 335, the dummy circuit pattern 333 may not be formed in a loop shape. The reason is that if the dummy circuit pattern 333 is formed in a loop shape, interference due to a loop circuit occurs. Furthermore, the first circuit pattern 332 and the second circuit pattern 335 may be electrically connected to each other by a control circuit, while the dummy circuit patterns 333 may not be electrically connected to each other.

Figure 4:
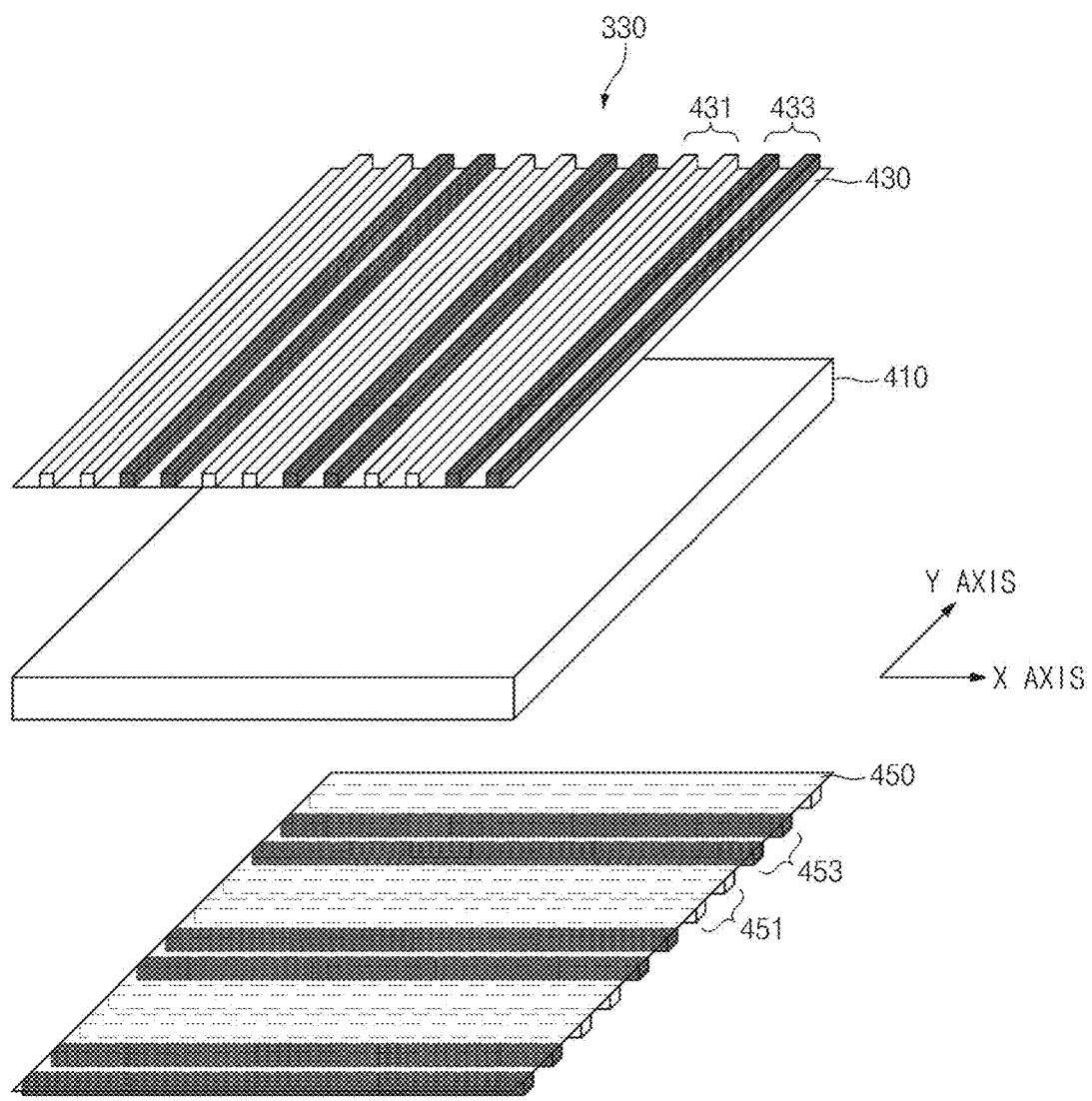
FIG. 4 is an exploded perspective view of a portion of a digitizer for describing a configuration of a circuit pattern according to an embodiment of the present disclosure.

FIG. 4 is an exploded perspective view of a portion of a digitizer for describing a configuration of a circuit pattern according to an embodiment of the present disclosure.

Referring to FIG. 4, a digitizer (e.g., the digitizer 330 of FIG. 3) may include an insulating layer 410, a first circuit layer 430, and a second circuit layer 450. The insulating layer 410 may be configured the same as or similar to the second insulating layer 334 of FIG. 3. The insulating layer 410 may include an insulating material such as polyimide. Circuit layers patterned in different directions may be formed on opposite surfaces of the insulating layer 410. For example, the first circuit layer 430 patterned in an abscissa (or y-axis) direction may be formed on one of opposite surfaces of the insulating layer 410, and the second circuit layer 430 patterned in an ordinate (or x-axis) direction may be formed on the other surface thereof. According to an embodiment, the first circuit layer 430 or the second circuit layer 450 may be formed on at least one surface of the insulating layer 410.

Each of the first circuit layer 430 and the second circuit layer 450 may include a conductive circuit pattern and a dummy circuit pattern. For example, the first circuit layer 430 may include a first conductive circuit pattern 431 and a first dummy circuit pattern 433. The first conductive circuit pattern 431 may be formed such that circuits including a conductive material such as CU are arranged regularly. Conductive circuits constituting the first conductive circuit pattern 431 may form a loop. The conductive circuits may be composed of a plurality of circuit lines which are arranged to be spaced from each other by an interval within a specific range. A plurality of circuit lines may be arranged in a specific direction so as to be spaced from each other by an interval within a specific range, and one ends of at least two circuit lines may be electrically connected to each other.

According to various embodiments, the first dummy circuit pattern 433 may be formed such that circuits including a material the same as or similar to the first conductive circuit pattern 431 are arranged regularly. Unlike the first conductive circuit pattern 433, circuits constituting the first dummy circuit pattern 433 may not form a loop. Furthermore, circuits constituting the first dummy circuit pattern 433 may not be electrically connected with a control circuit such that no current flows to the circuits constituting the first dummy circuit pattern 433. According to an embodiment, the circuits constituting the first dummy circuit patterns 433 may be composed of a plurality of dummy lines arranged to be spaced from each other by an interval within a specific range. The dummy lines may be arranged in a specific direction so as to be spaced from each other by an interval within a specific range. According to various embodiments, the first dummy circuit pattern 433 may be the same as or similar to the first conductive circuit pattern 431 in shape, interval, or material.

As in the first circuit layer 430, the second circuit layer 450 may include a second conductive circuit pattern 451 and a second dummy circuit pattern 453. However, a direction in which the second conductive circuit pattern 451 and the second dummy circuit pattern 453 are arranged may be different from a direction in which the first conductive circuit pattern 431 and the first dummy circuit pattern 433 are arranged. In the embodiment illustrated in FIG. 4, circuits of the first layer 430 are patterned in the abscissa and circuits of the second layer 450 are patterned in the ordinate. According to various embodiments, at least one of the first dummy circuit pattern 433 included in the first circuit layer 430 or the second dummy circuit pattern 453 included in the second circuit layer 450 may be omitted.

Figure 5:
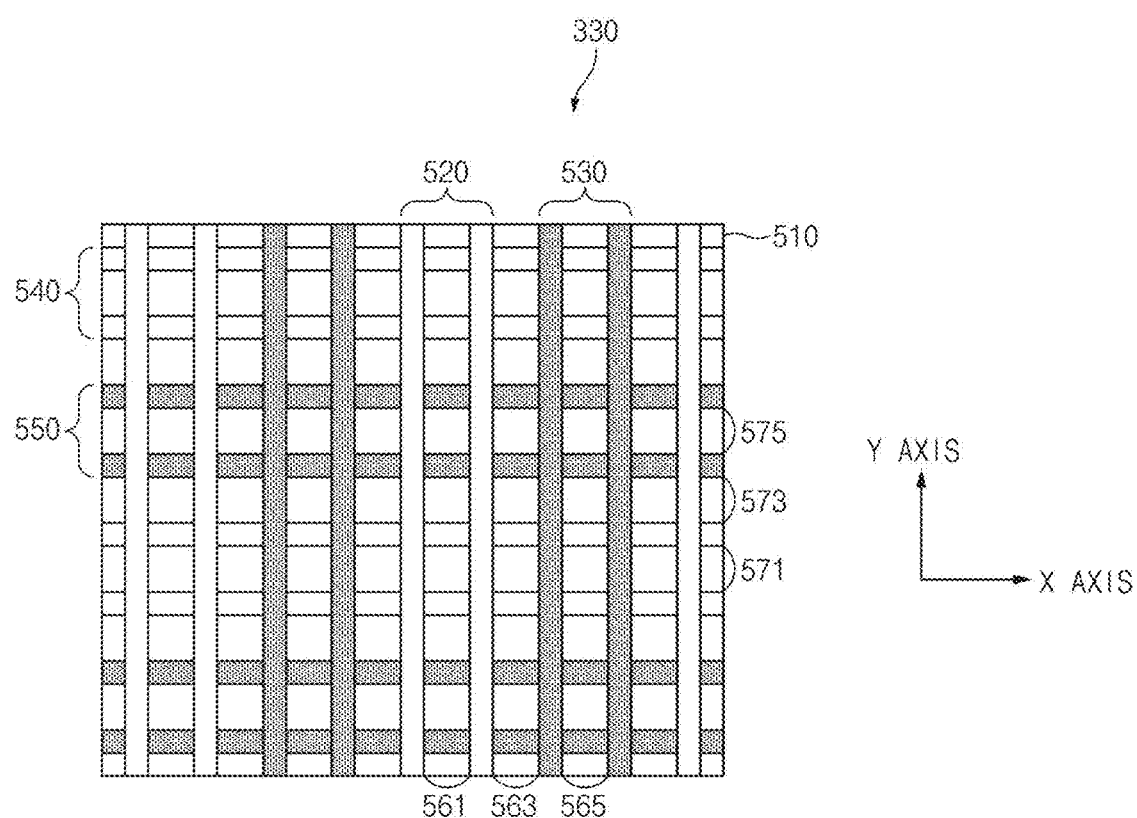
FIG. 5 shows a circuit pattern of a lattice shape according to an embodiment of the present disclosure.

FIG. 5 shows a circuit pattern of a lattice shape according to an embodiment of the present disclosure.

Referring to FIG. 5, circuit layers are formed on opposite surfaces of an insulating layer (e.g., the second insulating layer 334 of FIG. 3 or the insulating layer 410 of FIG. 4) of a digitizer, with the insulating layer not illustrated.

Referring to FIG. 5, a circuit layer 510 of a digitizer (e.g., the digitizer 330 of FIG. 3) may be formed to have a circuit pattern of a lattice shape. For example, the circuit layer 510 may be formed such that a first conductive circuit pattern 520 and a first dummy circuit pattern 530 of an abscissa (e.g., y-axis) direction are arranged at equal intervals and a second conductive circuit pattern 540 and a second dummy circuit pattern 550 of an ordinate (e.g., x-axis) direction are arranged at equal intervals. According to an embodiment, circuits constituting a conductive circuit pattern (e.g., the first conductive circuit pattern 520 and the second conductive circuit pattern 540) and circuits constituting a dummy circuit pattern (e.g., the first dummy circuit pattern 530 and the second dummy circuit pattern 550) may be formed such that two circuit lines are arranged to be spaced from each other by a specific interval and the other two circuit lines are arranged to be spaced from the two circuit lines by a specific interval. The shape may be, for example, a shape of a lattice structure. According to an embodiment, circuits constituting the conductive circuit pattern and the dummy circuit pattern may include the same or similar material.

According to various embodiments, circuits constituting the conductive circuit pattern and the dummy circuit pattern may be formed such that intervals among the circuits or heights of the circuits are regular. For example, an interval 561 between two adjacent circuit lines constituting the first conductive circuit pattern 520, an interval 563 between the first conductive circuit pattern 520 and the first dummy circuit pattern 530, and an interval 565 between two adjacent dummy lines constituting the first dummy circuit pattern 530 may be the same as each other or may have a difference within a specific tolerance range. Furthermore, the interval 571 between the two adjacent circuit lines constituting the first conductive circuit pattern 540, the interval 573 between the first conductive circuit pattern 540 and the first dummy circuit pattern 550, and an interval 575 between two adjacent dummy lines constituting the second dummy circuit pattern 560 may be the same as each other or may have a difference within a specific tolerance range. According to an embodiment, an interval between circuits (e.g., circuits constituting the first conductive circuit pattern 520 and the first dummy circuit pattern 530) of the ordinate (or y-axis) direction and an interval between circuits (e.g., circuits constituting the second conductive circuit pattern 540 and the second dummy circuit pattern 550) of the abscissa (or x-axis) direction may be the same as each other or may have a difference within a specific tolerance range. According to an embodiment, the conductive circuit pattern and the dummy circuit pattern may be formed such that line thicknesses of the circuits are the same as or similar to each other.

Figure 6:
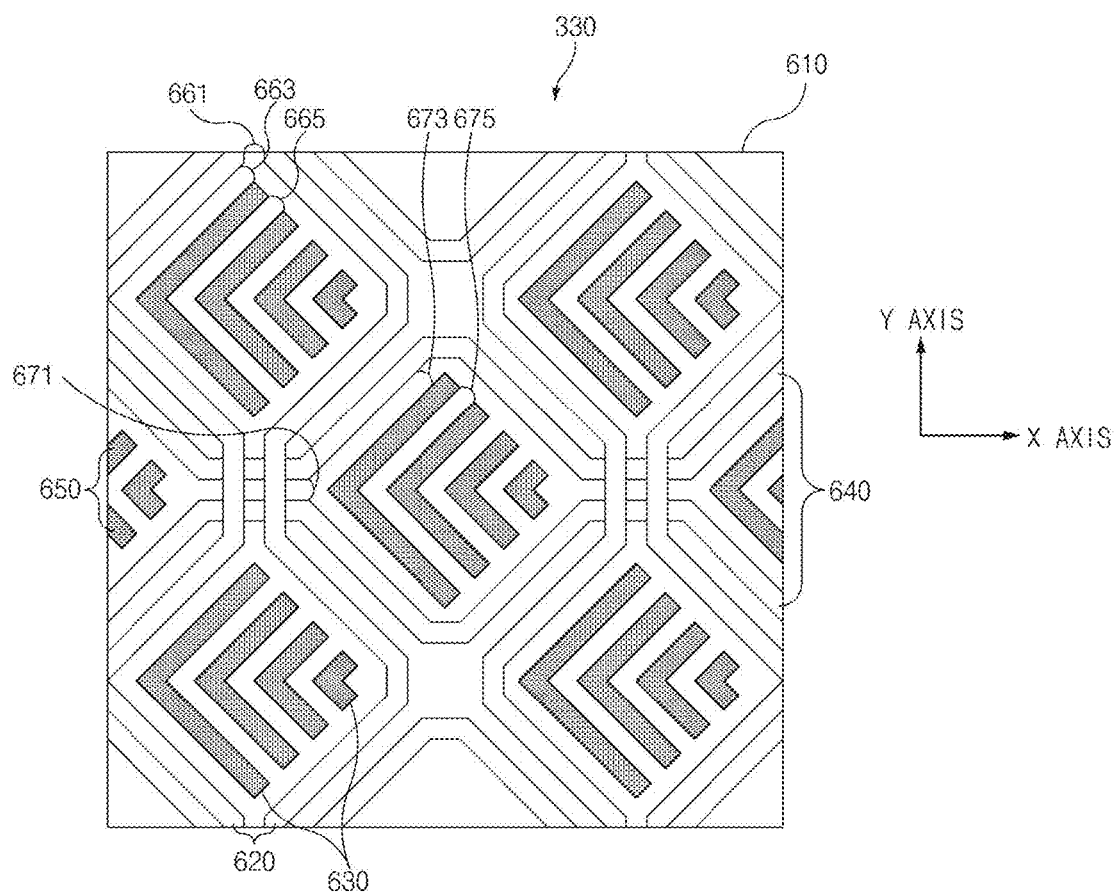
FIG. 6 shows a circuit pattern of a lozenge shape according to an embodiment of the present disclosure.

FIG. 6 shows a circuit pattern of a lozenge shape according to an embodiment of the present disclosure.

Referring to FIG. 6, circuit layers are formed on opposite surfaces of an insulating layer (e.g., the second insulating layer 334 of FIG. 3 or the insulating layer 410 of FIG. 4) of a digitizer, with the insulating layer not illustrated.

Referring to FIG. 6, a circuit layer 610 of a digitizer (e.g., the digitizer 330 of FIG. 3) may be formed to have a circuit pattern of a lozenge shape. For example, the first conductive circuit pattern 620 of the circuit layer 610 may define lozenge shapes arranged in an ordinate (or y-axis) direction, and the second conductive circuit pattern 640 of the circuit layer 610 may define lozenge shapes arranged in an abscissa (or x-axis) direction. Circuits included in the first conductive circuit pattern 620 may be arranged such that the increase and decrease of a distance from the center axis is repeated on the basis of the ordinate, and one ends of at least two circuit lines may be electrically connected to each other to form a loop. Furthermore, circuits included in the second conductive circuit pattern 640 may be arranged such that the increase and decrease of a distance from the center axis is repeated on the basis of the abscissa, and one ends of at least two circuit lines may be electrically connected to each other to form a loop.

In a circuit pattern of a lozenge shape, intervals among circuit lines constituting a conductive circuit pattern (e.g., the first conductive circuit pattern 620 and the second conductive circuit pattern 640) may be irregular. Accordingly, the arrangement of dummy circuit patterns (e.g., the first dummy circuit pattern 630 and the second dummy circuit pattern 650) may be important. According to an embodiment, the dummy circuit pattern may be formed in an area corresponding to a lozenge shape defined by the conductive circuit pattern, and circuits of the dummy circuit pattern may be arranged at regular intervals. For example, the dummy circuit pattern may be composed of a plurality of dummy lines formed in an area corresponding to the lozenge shape, defined by the conductive circuit pattern, at regular intervals. According to an embodiment, a plurality of dummy lines each of which has a bending line (e.g., an "L" shape) bent at least once may be arranged in an area corresponding to the lozenge shape at regular intervals. In this case, the dummy lines may be bent in the same direction or in opposite directions so as to surround each other. According to an embodiment, a plurality of linear (or straight line shaped) dummy lines having the same length may be arranged in an area corresponding to the lozenge shape at regular intervals. In addition, the dummy circuit pattern may include all patterns formed such that an interval of two adjacent circuit lines constituting the conductive circuit pattern and disposed in the lozenge shape, an interval between the conductive circuit pattern and the dummy circuit pattern, and an interval between two adjacent dummy lines constituting the dummy circuit pattern are the same as each other or have a difference within a specific tolerance range.

As described above, if the dummy circuit pattern of a specific shape is formed in an area corresponding to a lozenge shape defined by the conductive circuit pattern, an interval 661 between two adjacent circuit lines constituting the first conductive circuit pattern 620, an interval 663 between the first conductive circuit pattern 620 and the first dummy circuit pattern 630, and an interval 665 between two adjacent dummy lines constituting the first dummy circuit pattern 630 may be the same as each other or may have a difference within a specific tolerance range. Furthermore, the interval 671 between the two adjacent circuit lines constituting the first conductive circuit pattern 640, the interval 673 between the first conductive circuit pattern 640 and the first dummy circuit pattern 650, and an interval 675 between two adjacent dummy lines constituting the second dummy circuit pattern 650 may be the same as each other or may have a difference within a specific tolerance range. According to an embodiment, an interval between circuits of an ordinate (or y-axis) direction and an interval between circuits of an abscissa (or x-axis) direction may be the same as each other or may have a difference within a specific tolerance range.

According to various embodiments, an area where lozenge shapes defined by the conductive circuit pattern are connected may be relatively widely formed with a specific interval. Furthermore, the dummy circuit pattern may be formed at the connected area, and the dummy circuit pattern may be repeated at regular intervals. The dummy circuit pattern may be formed with a specific interval at an area adjacent to a lozenge shape defined by the conductive circuit pattern, (i.e., an intersection of a lozenge shape formed in the ordinate and a lozenge shape formed in the abscissa), and the dummy circuit pattern may be repeated at regular intervals.

According to various embodiments, the circuit layer 610 of the digitizer may be formed in various shapes as well as the above-described patterns. For example, the circuit layer 610 may be formed with a circuit pattern of a honeycomb shape in which hexagons are iteratively arranged. In this case, the dummy circuit pattern may be formed such that intervals among circuits constituting the circuit layer 610 are the same as each other or have a difference within a specific tolerance range as a plurality of circuits is arranged in an area corresponding to a hexagon shape with specific shape and interval. In the case where the circuit layer 610 of the digitizer is formed with a pattern in which a specific shape is iteratively formed, the dummy circuit pattern may be formed in at least one of an inner area of the shape, a shape-connected area, or an outer area adjacent to the shape. In this case, the dummy circuit pattern may be formed such that an interval between two adjacent circuit lines forming the shape, an interval between the conductive circuit pattern and the dummy circuit pattern forming the shape, and an interval between two adjacent dummy lines constituting the dummy circuit pattern are the same as each other or have a difference within a specific tolerance range.

As described above, according to various embodiments of the present disclosure, an electronic device may include a reflector sheet disposed under a display panel and a digitizer disposed under the reflector sheet. The digitizer may include a first circuit layer including a conductive circuit pattern arranged in a first direction, a second circuit layer including a conductive circuit pattern arranged in a second direction, and an insulating layer electrically isolating the first circuit layer and the second circuit layer. The digitizer may further include at least one dummy circuit pattern formed on at least one of the first circuit layer or the second circuit layer.

According to various embodiments, conductive circuits constituting the conductive circuit pattern may form a loop, and dummy circuits constituting the dummy circuit pattern may not form a loop.

According to various embodiments, at least one of a height or a thickness of dummy circuits constituting the dummy circuit pattern and at least one of a height or a thickness of conductive circuits constituting the conductive circuit pattern may be the same as each other or may have a difference within a specific tolerance range.

According to various embodiments, dummy circuits constituting the dummy circuit pattern may be spaced from conductive circuits constituting the conductive circuit pattern by a specific interval.

According to various embodiments, dummy circuits constituting the dummy circuit pattern may be formed such that an interval between adjacent two dummy lines constituting the dummy circuits and an interval between a specific dummy circuit pattern and a specific conductive circuit pattern may be the same as each other or may have a difference within a specific tolerance range.

According to various embodiments, dummy circuits constituting the dummy circuit pattern may be formed such that an interval between adjacent two dummy lines constituting the dummy circuits and an interval between adjacent two circuit lines corresponding to conductive circuits constituting the conductive circuit pattern may be the same as each other or may have a difference within a specific tolerance range.

According to various embodiments, the conductive circuit pattern may be formed such that at least one straight line shaped circuit line of an ordinate or abscissa direction is repeated at regular intervals, and the dummy circuit pattern may be formed such that at least one straight line shaped dummy line of a same direction as the circuit line is repeated at regular intervals.

According to various embodiments, the conductive circuit pattern may have at least one shape and may be repeated at regular intervals. The dummy circuit pattern may be formed such that at least one dummy circuit is repeated at regular intervals in an area corresponding to the shape.

According to various embodiments, each of dummy lines corresponding to dummy circuits constituting the dummy circuit pattern may be a bending line bent at least once, and at least one may be bent in a same direction or in an opposite direction so as to surround each other.

According to various embodiments, at least one of the dummy lines corresponding to dummy circuits constituting the dummy circuit pattern may be a bending line bent at least once and at least one of the others thereof may be a straight line. The at least one straight line shaped dummy line may be formed in parallel with at least one side of the bending line shaped dummy line.

According to various embodiments, dummy lines corresponding to dummy circuits constituting the dummy circuit pattern may be a straight line and may be arranged in parallel with at least one side of the shape.

According to various embodiments, no current may flow through dummy circuits constituting the dummy circuit pattern.

According to various embodiments, an electronic device may include a case forming an appearance of the electronic device, a display panel disposed in the case, a reflector sheet disposed under the display panel, and a digitizer disposed between the case and the reflector sheet. The digitizer may include a first circuit layer including a conductive circuit pattern arranged in a first direction, a second circuit layer including a conductive circuit pattern arranged in a second direction, and an insulating layer electrically isolating the first circuit layer and the second circuit layer. The digitizer may further include at least one dummy circuit which is formed on at least one of the first circuit layer or the second circuit layer, and the at least one dummy circuit is repeated to be spaced from conductive circuits constituting the conductive circuit pattern by a regular interval.

According to various embodiments, an electronic device may include a reflector sheet disposed under a display panel and a digitizer disposed under the reflector sheet. The digitizer may include an insulating layer, and at least one circuit layer formed on at least one surface of the insulating layer. The circuit layer may comprise a conductive circuit pattern and a dummy circuit pattern.

According to various embodiments, the conductive circuit pattern and the dummy circuit pattern may be formed on a surface adjacent to the reflector sheet.

Figure 7:
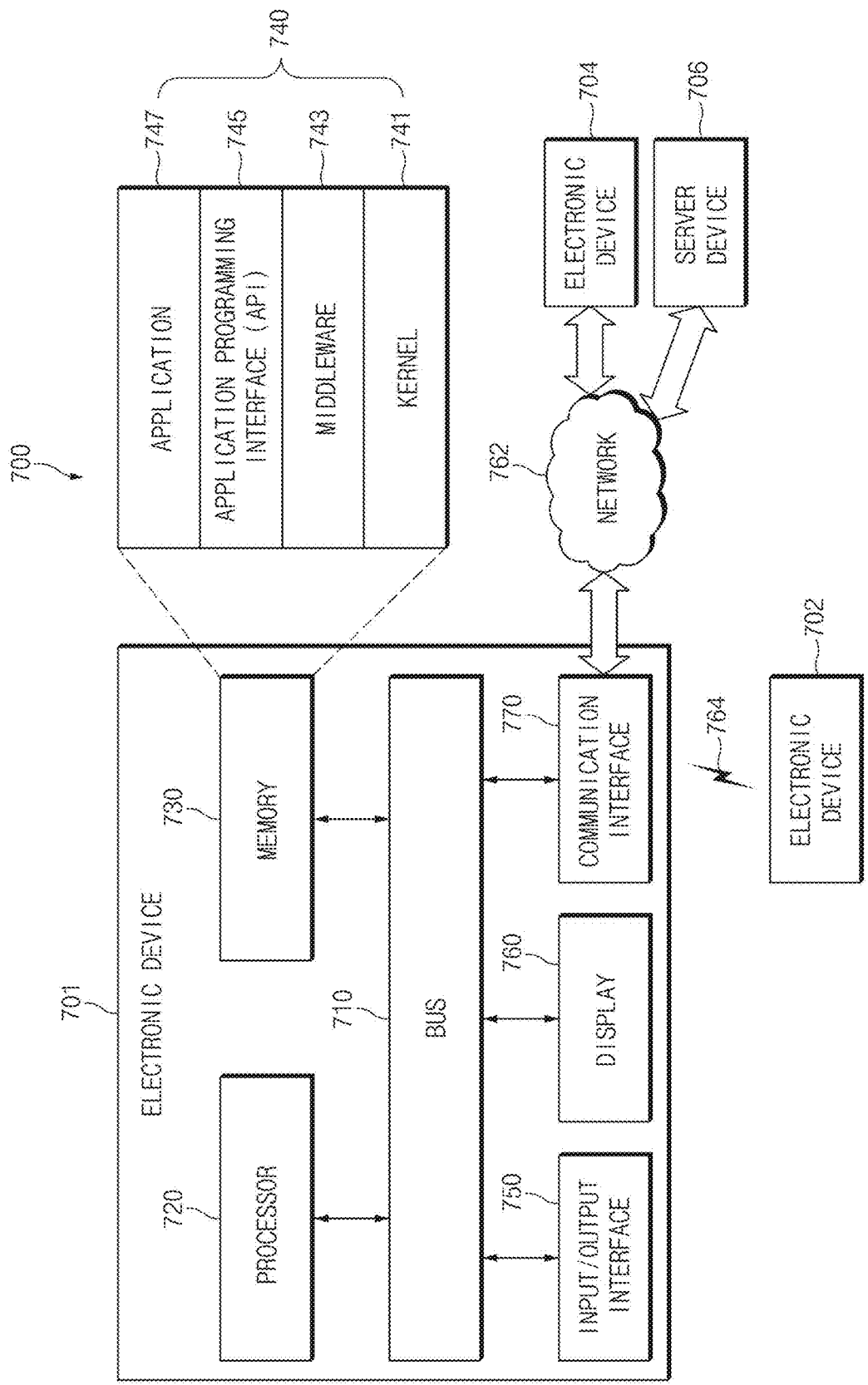
FIG. 7 is a block diagram of an electronic device in a network environment according to an embodiment of the present disclosure.

FIG. 7 is a block diagram of an electronic device in a network environment according to an embodiment of the present disclosure.

Referring to FIG. 7, an electronic device 701 in a network environment 700 may include a bus 710, a processor 720, a memory 730, an input/output (I/O) interface 750, a display 760, and a communication interface 770. According to an embodiment, the electronic device 701 may omit at least one of the above-described components or may further include other component(s).

The bus 710 may interconnect the above-described components 710 to 770 and may be a circuit for conveying communications (e.g., a control message and/or data) among the above-described components.

The processor 720 may include one or more of a CPU, an AP, or a communication processor (CP). The processor 720 may perform, for example, data processing or an operation associated with control or communication of at least one other component(s) of the electronic device 701.

The memory 730 may include a volatile and/or nonvolatile memory. The memory 730 may store instructions or data associated with at least one other component(s) of the electronic device 701. According to an embodiment, the memory 730 may store software and/or a program 740. The program 740 may include, for example, a kernel 741, a middleware 743, an application programming interface (API) 745, and/or an application program (or an application) 747. At least a portion of the kernel 741, the middleware 743, or the API 745 may be called an "operating system (OS)".

The kernel 741 may control or manage system resources (e.g., the bus 710, the processor 720, the memory 730, and the like) that are used to execute operations or functions of other programs (e.g., the middleware 743, the API 745, and the application program 747). The kernel 741 may provide an interface that allows the middleware 743, the API 745, or the application program 747 to access discrete components of the electronic device 701 so as to control or manage system resources.

The middleware 743 may perform a mediation role such that the API 745 or the application program 747 communicates with the kernel 741 to exchange data. The middleware 743 may process task requests received from the application program 747 according to a priority. For example, the middleware 743 may assign the priority, which makes it possible to use a system resource (e.g., the bus 710, the processor 720, the memory 730, or the like) of the electronic device 701, to at least one of the application program 747. The middleware 743 may process the one or more task requests according to the priority assigned to the at least one, which makes it possible to perform scheduling or load balancing on the one or more task requests.

The API 745 may be an interface through which the application program 747 controls a function provided by the kernel 741 or the middleware 743, and may include, for example, at least one interface or function (e.g., an instruction) for a file control, a window control, image processing, a character control, or the like.

The I/O interface 750 may transmit an instruction or data, input from a user or another external device, to other component(s) of the electronic device 701. Furthermore, the I/O interface 750 may output an instruction or data, received from other component(s) of the electronic device 701, to a user or another external device.

The display 760 may include, for example, a liquid crystal display (LCD), a LED display, an organic LED (OLED) display, or a microelectromechanical systems (MEMS) display, or an electronic paper display. The display 760 may display, for example, various content (e.g., text, images, video, icons, symbols, and the like) to a user. The display 760 may include a touch screen and may receive, for example, a touch, gesture, proximity, or hovering input using an electronic pen or a portion of a user's body.

The communication interface 770 may establish communication between the electronic device 701 and an external electronic device (e.g., a first external electronic device 702, a second external electronic device 704, or a server 706). For example, the communication interface 770 may be connected to the network 762 through wireless communication or wire communication and may communicate with an external device (e.g., the second external electronic device 704 or the server 706).

The wireless communication may include at least one of, for example, long-term evolution (LTE), LTE-advance (LTE-A), code division multiple access (CDMA), wideband CDMA (WCDMA), universal mobile telecommunications system (UMTS), wireless broadband (WiBro), or global system for mobile communications (GSM), or the like, as cellular communication protocol. Furthermore, the wireless communication may include, for example, a local area network 764. The local area network 764 may include at least one of Wi-Fi, a near field communication (NFC), or a global navigation satellite system (GNSS), or the like. The GNSS may include at least one of a GPS, a global navigation satellite system (Glonass), Beidou navigation satellite system (Beidou), Galileo (the European global satellite-based navigation system), or the like. In this specification, "GPS" and "GNSS" may be used interchangeably. The wired communication may include at least one of, for example, a universal serial bus (USB), a high definition multimedia interface (HDMI), a recommended standard-132 (RS-132), or a plain old telephone service (POTS). The network 762 may include at least one of telecommunications networks, for example, a computer network (e.g., local area network (LAN) or wide area network (WAN)), an Internet, or a telephone network.

Each of the external first and second external electronic devices 702 and 704 may be a device of which the type is different from or the same as that of the electronic device 701. According to an embodiment, the server 706 may include a group of one or more servers. According to various embodiments, all or a part of operations that the electronic device 701 will perform may be executed by another or plural electronic devices (e.g., the electronic devices 702 and 704 and the server 706). According to an embodiment, in the case where the electronic device 701 executes any function or service automatically or in response to a request, the electronic device 701 may not perform the function or the service internally, but may request at least a portion of a function associated with the electronic device 701 at other device (e.g., the electronic device 702 or 704 or the server 706). The other electronic device (e.g., the electronic device 702 or 704 or the server 706) may execute the requested function or additional function and may transmit the execution result to the electronic device 701. The electronic device 701 may provide the requested function or service using the received result or may additionally process the received result to provide the requested function or service. To this end, for example, cloud computing, distributed computing, or client-server computing may be used.

Figure 8:
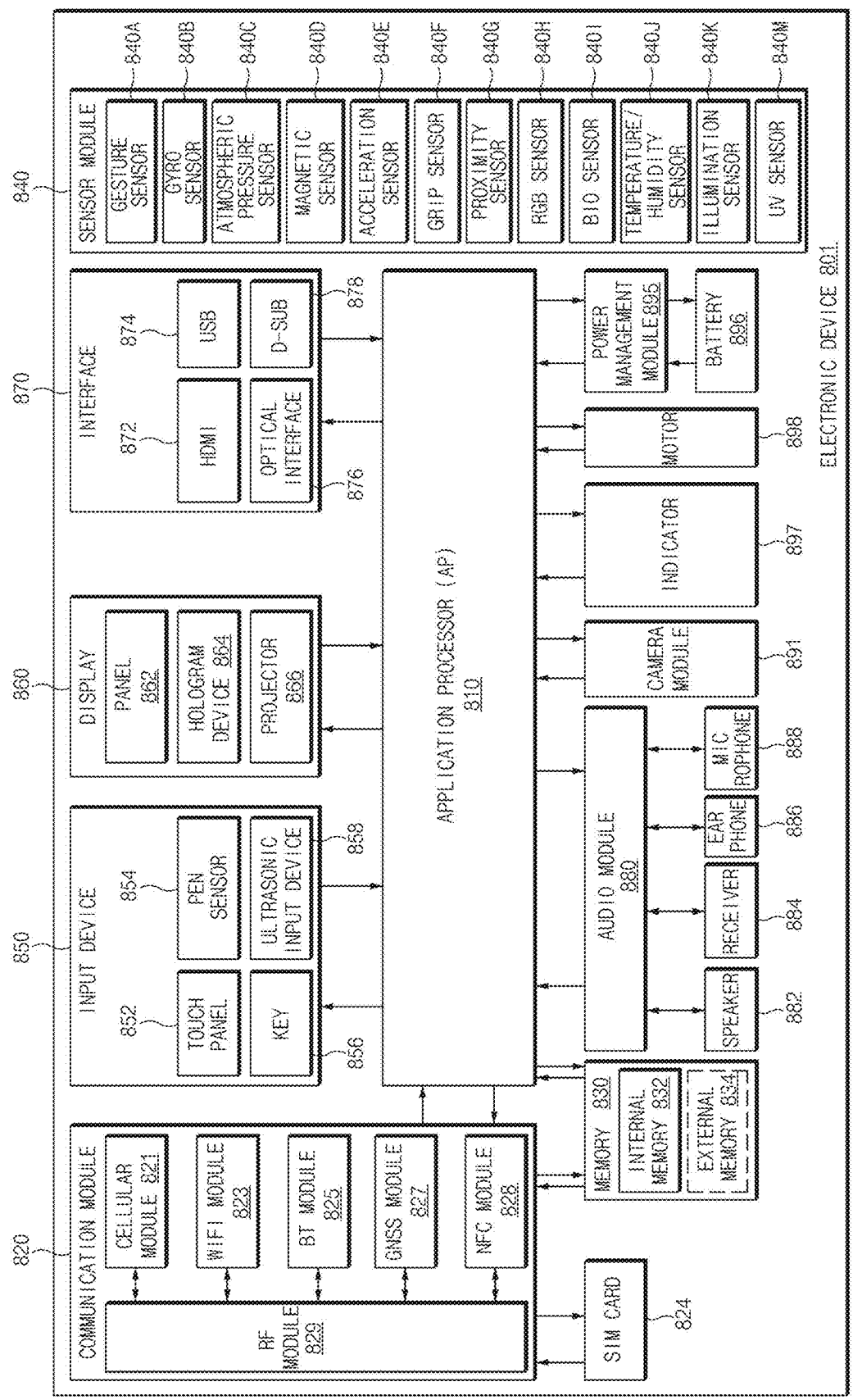
FIG. 8 is a block diagram of an electronic device according to an embodiment of the present disclosure.

FIG. 8 is a block diagram illustrating an electronic device 801 according to an embodiment of the present disclosure.

Referring to FIG. 8, an electronic device 801 may include, for example, all or a part of the electronic device 701 illustrated in FIG. 7. The electronic device 801 may include one or more processors (e.g., an AP) 810, a communication module 820, a subscriber identification module 824, a memory 830, a sensor module 840, an input device 850, a display 860, an interface 870, an audio module 880, a camera module 891, a power management module 895, a battery 896, an indicator 897, and a motor 898.

The processor 810 may drive an OS or an application to control a plurality of hardware or software components connected to the processor 810 and may process and compute a variety of data. The processor 810 may be implemented with a system on chip (SoC). According to an embodiment of the present disclosure, the processor 810 may further include a graphic processing unit (GPU) and/or an image signal processor (ISP). The processor 810 may include at least a part (e.g., a cellular module 821) of components illustrated in FIG. 8. The processor 810 may load and process an instruction or data, which is received from at least one of other components (e.g., a nonvolatile memory), and may store a variety of data at a nonvolatile memory.

The communication module 820 may be configured the same as or similar to a communication interface 770 of FIG. 7. The communication module 820 may include the cellular module 821, a Wi-Fi module 823, a Bluetooth (BT) module 825, a GNSS module 827 (e.g., a GPS module, a Glonass module, Beidou module, or a Galileo module), an NFC module 828, and a radio frequency (RF) module 829.

The cellular module 821 may provide voice communication, video communication, a character service, an Internet service or the like through a communication network. According to an embodiment of the present disclosure, the cellular module 821 may perform discrimination and authentication of the electronic device 801 within a communication network using a subscriber identification module 824 (e.g., a subscriber identity module (SIM) card), for example. According to an embodiment of the present disclosure, the cellular module 821 may perform at least a portion of functions that the processor 810 provides. According to an embodiment, the cellular module 821 may include a CP.

Each of the Wi-Fi module 823, the BT module 825, the GNSS module 827, and the NFC module 828 may include a processor for processing data exchanged through a corresponding module, for example. According to an embodiment, at least a portion (e.g., two or more components) of the cellular module 821, the Wi-Fi module 823, the BT module 825, the GNSS module 827, and the NFC module 828 may be included within one integrated circuit (IC) or an IC package.

The RF module 829 may transmit and receive, for example, a communication signal (e.g., an RF signal). The RF module 829 may include a transceiver, a power amplifier module (PAM), a frequency filter, a low noise amplifier (LNA), an antenna, or the like. According to various embodiments, at least one of the cellular module 821, the Wi-Fi module 823, the BT module 825, the GNSS module 827, or the NFC module 828 may transmit and receive an RF signal through a separate RF module.

The subscriber identification module 824 may include, for example, a subscriber identification module and may include unique identity information (e.g., integrated circuit card identifier (ICCID)) or subscriber information (e.g., integrated mobile subscriber identity (IMSI)).

The memory 830 (e.g., the memory 730) may include an internal memory 832 or an external memory 834. For example, the internal memory 832 may include at least one of a volatile memory (e.g., a dynamic random access memory (DRAM), a static RAM (SRAM), or a synchronous DRAM (SDRAM)), a nonvolatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM, a NAND flash memory, or a NOR flash memory), a hard drive, or a solid state drive (SSD).

The external memory 834 may include a flash drive, such as compact flash (CF), secure digital (SD), micro-SD, mini-SD, extreme digital (xD), multimedia card (MMC), a memory stick, or the like. The external memory 834 may be functionally and/or physically connected to the electronic device 801 through various interfaces.

The sensor module 840 may measure, for example, a physical quantity or may detect an operation state of the electronic device 801. The sensor module 840 may convert the measured or detected information to an electric signal. The sensor module 840 may include at least one of a gesture sensor 840A, a gyro sensor 840B, a barometric pressure sensor 840C, a magnetic sensor 840D, an acceleration sensor 840E, a grip sensor 840F, a proximity sensor 840G, a color sensor 840H (e.g., red, green, blue (RGB) sensor), a biometric sensor 840I, a temperature/humidity sensor 840J, an illuminance sensor 840K, or an UV sensor 840M. Even though not illustrated, additionally or alternatively, the sensor module 840 may further include, for example, an E-nose sensor, an electromyography sensor (EMG) sensor, an electroencephalogram (EEG) sensor, an electrocardiogram (ECG) sensor, a photoplethysmographic (PPG) sensor, an infrared (IR) sensor, an iris sensor, and/or a fingerprint sensor. The sensor module 840 may further include a control circuit for controlling at least one or more sensors included therein. According to an embodiment of the present disclosure, the electronic device 801 may further include a processor which is a part of the processor 810 or independent of the processor 810 and is configured to control the sensor module 840. The processor may control the sensor module 840 while the processor 810 remains at a sleep state.

The input device 850 may include, for example, a touch panel 852, a (digital) pen sensor 854, a key 856, or an ultrasonic input device 858. The touch panel 852 may use at least one of capacitive, resistive, infrared and ultrasonic detecting methods. The touch panel 852 may further include a control circuit. The touch panel 852 may further include a tactile layer to provide a tactile reaction to a user.

The (digital) pen sensor 854 may be, for example, a part of a touch panel or may include an additional sheet for recognition. The key 856 may include, for example, a physical button, an optical key, a keypad, and the like. The ultrasonic input device 858 may detect (or sense) an ultrasonic signal, which is generated from an input device, through a microphone (e.g., a microphone 888) and may check data corresponding to the detected ultrasonic signal.

The display 860 (e.g., the display 760) may include a panel 862, a hologram device 864, or a projector 866. The panel 862 may be configured the same as or similar to a display 760 of FIG. 7. The panel 862 may be implemented to be flexible, transparent or wearable, for example. The panel 862 and the touch panel 852 may be integrated into a single module. The hologram device 864 may display a stereoscopic image in a space using a light interference phenomenon. The projector 866 may project light onto a screen so as to display an image. The screen may be arranged inside or outside the electronic device 801. According to an embodiment of the present disclosure, the display 860 may further include a control circuit for controlling the panel 862, the hologram device 864, or the projector 866.

The interface 870 may include, for example, an HDMI 872, a USB 874, an optical interface 876, or a D-sub (D-subminiature) 878. The interface 870 may be included, for example, in a communication interface 770 illustrated in FIG. 7. Additionally or alternatively, the interface 870 may include, for example, a mobile high definition link (MHL) interface, a SD card/multi-media card (MMC) interface, or an infrared data association (IrDA) standard interface.

The audio module 880 may convert a sound and an electric signal in dual directions. At least a portion of the audio module 880 may be included, for example, in an I/O interface 750 illustrated in FIG. 7. The audio module 880 may process, for example, sound information that is input or output through a speaker 882, a receiver 884, an earphone 886, or a microphone 888.

The camera module 891 for shooting a still image or a video may include, for example, at least one image sensor (e.g., a front sensor or a rear sensor), a lens, an ISP, or a flash (e.g., an LED or a xenon lamp)

The power management module 895 may manage, for example, power of the electronic device 801. According to an embodiment of the present disclosure, a power management IC (PMIC) a charger IC, or a battery or fuel gauge may be included in the power management module 895. The PMIC may have a wired charging method and/or a wireless charging method. The wireless charging method may include, for example, a magnetic resonance method, a magnetic induction method or an electromagnetic method and may further include an additional circuit, for example, a coil loop, a resonant circuit, or a rectifier, and the like. The battery gauge may measure, for example, a remaining capacity of the battery 896 and a voltage, current or temperature thereof while the battery is charged. The battery 896 may include, for example, a rechargeable battery or a solar battery.

The indicator 897 may display a specific state of the electronic device 801 or a portion thereof (e.g., the processor 810), such as a booting state, a message state, a charging state, and the like. The motor 898 may convert an electrical signal into a mechanical vibration and may generate the following effects: vibration, haptic, and the like. Even though not illustrated, a processing device (e.g., a GPU) for supporting a mobile TV may be included in the electronic device 801. The processing device for supporting a mobile TV may process media data according to the standards of DMB, digital video broadcasting (DVB), MediaFlo™, or the like.

Each of the above-mentioned elements of the electronic device according to various embodiments of the present disclosure may be configured with one or more components, and the names of the elements may be changed according to the type of the electronic device. The electronic device according to various embodiments of the present disclosure may include at least one of the above-mentioned elements, and some elements may be omitted or other additional elements may be added. Furthermore, some of the elements of the electronic device according to various embodiments of the present disclosure may be combined with each other so as to form one entity, so that the functions of the elements may be performed in the same manner as before the combination.

Figure 9:
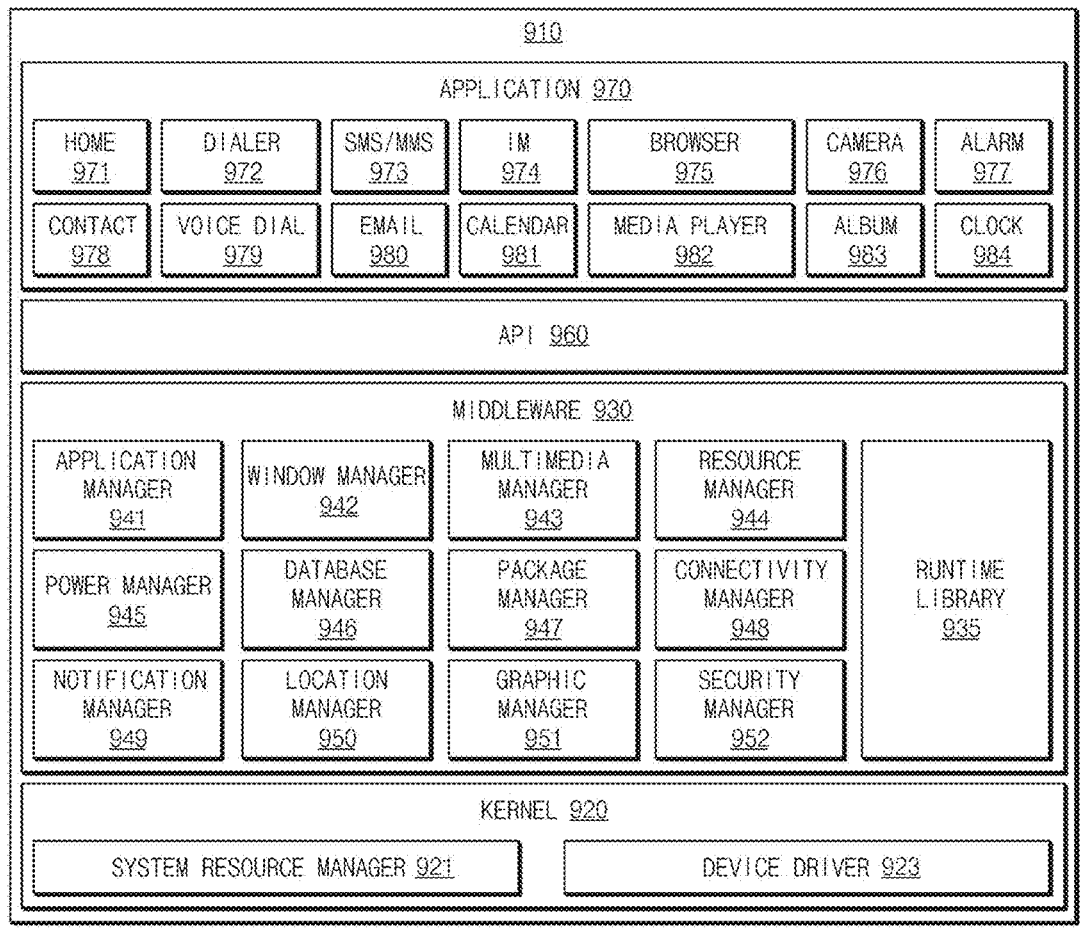
FIG. 9 is a block diagram of a program module according to an embodiment of the present disclosure.

FIG. 9 is a block diagram of a program module according to an embodiment of the present disclosure.

Referring to FIG. 9, according to an embodiment of the present disclosure, a program module 910 (e.g., a program 740) may include an OS to control resources associated with an electronic device (e.g., the electronic device 701), and/or diverse applications (e.g., the application program 747) driven on the OS. The OS may be, for example, Android, iOS, Windows, Symbian, Tizen, or Bada.

The program may include, for example, a kernel 920, a middleware 930, an API 960, and/or an application 970. At least a part of the program module 910 may be preloaded on an electronic device or may be downloadable from an external electronic device (e.g., the electronic device 702 or 704, the server 706, and the like).

The kernel 920 (e.g., the kernel 741) may include, for example, a system resource manager 921 or a device driver 923. The system resource manager 921 may perform control, allocation, or retrieval of system resources. According to an embodiment, the system resource manager 921 may include a process managing part, a memory managing part, or a file system managing part. The device driver 923 may include, for example, a display driver, a camera driver, a BT driver, a common memory driver, an USB driver, a keypad driver, a Wi-Fi driver, an audio driver, or an inter-process communication (IPC) driver.

The middleware 930 may provide, for example, a function which the application 970 needs in common, or may provide diverse functions to the application 970 through the API 960 to allow the application 970 to efficiently use limited system resources of the electronic device. According to an embodiment, the middleware 930 (e.g., the middleware 743) may include at least one of a runtime library 935, an application manager 941, a window manager 942, a multimedia manager 943, a resource manager 944, a power manager 945, a database manager 946, a package manager 947, a connectivity manager 948, a notification manager 949, a location manager 950, a graphic manager 951, or a security manager 952.

The runtime library 935 may include, for example, a library module which is used by a compiler to add a new function through a programming language while the application 970 is being executed. The runtime library 935 may perform I/O management, memory management, or capacities about arithmetic functions.

The application manager 941 may manage, for example, a life cycle of at least one application of the application 970. The window manager 942 may manage a GUI resource which is used in a screen. The multimedia manager 943 may identify a format necessary for playing diverse media files, and may perform encoding or decoding of media files by using a codec suitable for the format. The resource manager 944 may manage resources such as a storage space, memory, or source code of at least one application of the application 970.

The power manager 945 may operate, for example, with a basic I/O system (BIOS) to manage a battery or power, and may provide power information for an operation of an electronic device. The database manager 946 may generate, search for, or modify database which is to be used in at least one application of the application 970. The package manager 947 may install or update an application which is distributed in the form of package file.

The connectivity manager 948 may manage, for example, wireless connections such as Wi-Fi or BT. The notification manager 949 may display or notify an event such as arrival message, promise, or proximity notification in a mode that does not disturb a user. The location manager 950 may manage location information of an electronic device. The graphic manager 951 may manage a graphic effect that is provided to a user, or manage a user interface relevant thereto. The security manager 952 may provide a general security function necessary for system security or user authentication. According to an embodiment of the present disclosure, in the case where an electronic device (e.g., the electronic device 701) includes a telephony function, the middleware 930 may further includes a telephony manager for managing a voice or video call function of the electronic device.

The middleware 930 may include a middleware module that combines diverse functions of the above-described components. The middleware 930 may provide a module specialized to each OS kind to provide differentiated functions. Additionally, the middleware 930 may remove a part of the preexisting components, dynamically, or may add a new component thereto.

The API 960 (e.g., the API 745) may be, for example, a set of programming functions and may be provided with a configuration which is variable depending on an OS. For example, in the case where an OS is Android or the iOS, it may be permissible to provide one API set per platform. In the case where an OS is Tizen, it may be permissible to provide two or more API sets per platform.

The application 970 (e.g., the application program 747) may include, for example, one or more applications capable of providing functions for a home 971, a dialer 972, an short message service (SMS)/multimedia messaging service (MMS) 973, an instant message (IM) 974, a browser 975, a camera 976, an alarm 977, a contact 978, a voice dial 979, an e-mail 980, a calendar 981, a media player 982, am album 983, and a clock 984, or for offering health care (e.g., measuring an exercise quantity or blood sugar) or environment information (e.g., atmospheric pressure, humidity, or temperature).

According to an embodiment, the application 970 may include an application (hereinafter referred to as "information exchanging application" for descriptive convenience) to support information exchange between the electronic device (e.g., the electronic device 701) and an external electronic device (e.g., the electronic device 702 or 704). The information exchanging application may include, for example, a notification relay application for transmitting specific information to the external electronic device, or a device management application for managing the external electronic device.

For example, the information exchanging application may include a function of transmitting notification information, which arise from other applications (e.g., applications for SMS/MMS, e-mail, health care, or environmental information), to an external electronic device (e.g., the electronic device 702 or 704). Additionally, the information exchanging application may receive, for example, notification information from an external electronic device and provide the notification information to a user.

The device management application may manage (e.g., install, delete, or update), for example, at least one function (e.g., turn-on/turn-off of an external electronic device (or a part of components) or adjustment of brightness (or resolution) of a display) of the external electronic device (e.g., the electronic device 702 or 704) which communicates with the electronic device, an application running in the external electronic device, or a service (e.g., a call service or a message service) provided from the external electronic device.

According to an embodiment, the application 970 may include an application (e.g., a health care application) which is assigned in accordance with an attribute (e.g., an attribute of a mobile medical device as a kind of electronic device) of the external electronic device (e.g., the electronic device 702 or 704). According to an embodiment, the application 970 may include an application which is received from an external electronic device (e.g., the server 706 or the electronic device 702 or 704). According to an embodiment, the application 970 may include a preloaded application or a third party application which is downloadable from a server. The component titles of the program module 910 according to the embodiment of the present disclosure may be modifiable depending on kinds of OSs.

According to various embodiments of the present disclosure, at least a portion of the program module 910 may be implemented by software, firmware, hardware, or a combination of two or more thereof. At least a portion of the program module 910 may be implemented (e.g., executed), for example, by a processor (e.g., the processor 810). At least a portion of the program module 910 may include, for example, modules, programs, routines, sets of instructions, or processes, or the like for performing one or more functions.

The term "module" used herein may represent, for example, a unit including one or more combinations of hardware, software and firmware. The term "module" may be interchangeably used with the terms "unit", "logic", "logical block", "component" and "circuit". The "module" may be a minimum unit of an integrated component or may be a part thereof. The "module" may be a minimum unit for performing one or more functions or a part thereof. The "module" may be implemented mechanically or electronically. For example, the "module" may include at least one of an application-specific IC (ASIC) chip, a field-programmable gate array (FPGA), and a programmable-logic device for performing some operations, which are known or will be developed.

At least a portion of an apparatus (e.g., modules or functions thereof) or a method (e.g., operations) according to various embodiments of the present disclosure may be, for example, implemented by instructions stored in a computer-readable storage media in the form of a program module. The instruction, when executed by one or more processors (e.g., the processor 720), may cause the one or more processors to perform a function corresponding to the instruction. The computer-readable storage media, for example, may be the memory 730.

A computer-readable recording medium may include a hard disk, a magnetic media, a floppy disk, a magnetic media (e.g., a magnetic tape), an optical media (e.g., a compact disc ROM (CD-ROM) and a DVD, a magneto-optical media (e.g., a floptical disk), and hardware devices (e.g., a ROM, a RAM, or a flash memory). Also, a program instruction may include not only a mechanical code such as things generated by a compiler but also a high-level language code executable on a computer using an interpreter. The above hardware unit may be configured to operate via one or more software modules for performing an operation of the present disclosure, and vice versa.

A module or a program module according to various embodiments of the present disclosure may include at least one of the above elements, or a portion of the above elements may be omitted, or additional other elements may be further included. Operations performed by a module, a program module, or other elements according to various embodiments of the present disclosure may be executed sequentially, in parallel, repeatedly, or in a heuristic method. Also, a portion of operations may be executed in different sequences, omitted, or other operations may be added.

According to various embodiments of the present disclosure, it may be possible to prevent a white spot occurring due to irregular intervals among circuits formed on a circuit layer by adding a dummy circuit pattern on at least one circuit layer of a digitizer.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
a reflector sheet disposed under a display panel; and
a digitizer disposed under the reflector sheet,
wherein the digitizer comprises:
  a first circuit layer comprising a conductive circuit pattern arranged in a first direction;
  a second circuit layer comprising a conductive circuit pattern arranged in a second direction;
  an insulating layer electrically isolating the first circuit layer and the second circuit layer; and
  at least one dummy circuit pattern formed on at least one of the first circuit layer or the second circuit layer,
wherein the at least one dummy circuit pattern is electrically isolated, and
wherein the at least one dummy circuit pattern is based on a composition of the reflector sheet.

2. The electronic device of claim 1,
wherein conductive circuits constituting the conductive circuit pattern form a loop, and
wherein dummy circuits constituting the at least one dummy circuit pattern do not form a loop.

3. The electronic device of claim 1, wherein at least one of a height or a thickness of dummy circuits constituting the at least one dummy circuit pattern and at least one of a height or a thickness of conductive circuits constituting the conductive circuit pattern are the same as each other or have a difference within a specific tolerance range.

4. The electronic device of claim 1, wherein dummy circuits constituting the at least one dummy circuit pattern are spaced from conductive circuits constituting the conductive circuit pattern by a specific interval.

5. The electronic device of claim 1, wherein dummy circuits constituting the at least one dummy circuit pattern are formed such that an interval between adjacent two dummy lines constituting the dummy circuits and an interval between a specific dummy circuit pattern and a specific conductive circuit pattern are the same as each other or have a difference within a specific tolerance range.

6. The electronic device of claim 1, wherein dummy circuits constituting the at least one dummy circuit pattern are formed such that an interval between adjacent two dummy lines constituting the dummy circuits and an interval between adjacent two circuit lines corresponding to conductive circuits constituting the conductive circuit pattern are the same as each other or have a difference within a specific tolerance range.

7. The electronic device of claim 1,
wherein the conductive circuit pattern is formed such that at least one straight line shaped circuit line of an ordinate or abscissa direction is repeated at regular intervals, and
wherein the at least one dummy circuit pattern is formed such that at least one straight line shaped dummy line of a same direction as the circuit line is repeated at regular intervals.

8. The electronic device of claim 1,
wherein the conductive circuit pattern:
  has at least one shape, and
  is repeated at regular intervals, and
wherein the at least one dummy circuit pattern is formed such that at least one dummy circuit is repeated at regular intervals in an area corresponding to the at least one shape.

9. The electronic device of claim 8,
wherein each of dummy lines corresponding to dummy circuits constituting the at least one dummy circuit pattern is a bending line bent at least once, and
wherein at least one is bent in a same direction or in an opposite direction so as to surround each other.

10. The electronic device of claim 8,
wherein at least one dummy line corresponding to the at least one dummy circuit pattern is a bending line bent at least once and at least one of the others thereof is a straight line, and
wherein the straight line is formed in parallel with at least one side of the bending line.

11. The electronic device of claim 8, wherein dummy lines corresponding to dummy circuits constituting the at least one dummy circuit pattern are:
a straight line, and
arranged in parallel with at least one side of the at least one shape.

12. The electronic device of claim 1, wherein no current flows through dummy circuits constituting the at least one dummy circuit pattern.

13. An electronic device comprising:
a case;
a display panel disposed in the case;
a reflector sheet disposed under the display panel; and
a digitizer disposed between the case and the reflector sheet,
wherein the digitizer comprises:
  a first circuit layer comprising a conductive circuit pattern arranged in a first direction;
  a second circuit layer comprising a conductive circuit pattern arranged in a second direction;
  an insulating layer electrically isolating the first circuit layer and the second circuit layer; and
  at least one dummy circuit which is formed on at least one of the first circuit layer or the second circuit layer, the at least one dummy circuit having a dummy circuit pattern,
wherein the at least one dummy circuit is repeated to be spaced from conductive circuits constituting the conductive circuit pattern by a regular interval,
wherein the at least one dummy circuit is electrically isolated, and
wherein the dummy circuit pattern is based on a composition of the reflector sheet.

14. An electronic device comprising:
a reflector sheet disposed under a display panel; and
a digitizer disposed under the reflector sheet,
wherein the digitizer comprises:
  an insulating layer, and
  at least one circuit layer formed on at least one surface of the insulating layer,
wherein the circuit layer comprises:
  a conductive circuit pattern, and
  a dummy circuit pattern,
wherein the dummy circuit pattern is electrically isolated, and wherein the dummy circuit pattern is based on a composition of the reflector sheet.

15. The electronic device of claim 14, wherein the conductive circuit pattern and the dummy circuit pattern are formed on a surface adjacent to the reflector sheet.

16. The electronic device of claim 14, wherein no current flows through dummy circuits constituting the dummy circuit pattern.

* * * * *